(12) United States Patent
Mizutani et al.

(10) Patent No.: US 11,792,927 B2
(45) Date of Patent: Oct. 17, 2023

(54) INTERCONNECT SUBSTRATE

(71) Applicant: SHINKO ELECTRIC INDUSTRIES CO., LTD., Nagano (JP)

(72) Inventors: Rie Mizutani, Nagano (JP); Noriyoshi Shimizu, Nagano (JP); Hiroshi Taneda, Nagano (JP); Masaya Takizawa, Nagano (JP); Yoshiki Akiyama, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days.

(21) Appl. No.: 17/817,446

(22) Filed: Aug. 4, 2022

(65) Prior Publication Data
US 2023/0054390 A1    Feb. 23, 2023

(30) Foreign Application Priority Data
Aug. 20, 2021   (JP) ................... 2021-134822

(51) Int. Cl.
*H05K 1/11*   (2006.01)
*H05K 1/03*   (2006.01)
*H05K 3/46*   (2006.01)

(52) U.S. Cl.
CPC ........... *H05K 1/113* (2013.01); *H05K 1/0366* (2013.01); *H05K 3/4644* (2013.01); *H05K 2201/0212* (2013.01); *H05K 2201/068* (2013.01); *H05K 2201/09136* (2013.01)

(58) Field of Classification Search
CPC ........ H05K 1/115; H05K 1/116; H05K 1/112; H05K 1/113; H05K 1/114
See application file for complete search history.

(56) References Cited

U.S. PATENT DOCUMENTS 9,337,136 B2 *   5/2016   Tseng .................. H01L 21/4867

FOREIGN PATENT DOCUMENTS

JP   3786894   6/2006

* cited by examiner

*Primary Examiner* — Jeremy C Norris
(74) *Attorney, Agent, or Firm* — IPUSA, PLLC (57) ABSTRACT

An interconnect substrate includes a core layer including a resin layer mainly composed of a non-photosensitive thermosetting resin and a through interconnect extending through the resin layer, the core layer having no reinforcement member contained therein, a first interconnect structure laminated on a first side of the core layer and including first interconnect layers and first insulating layers mainly composed of a photosensitive resin, and a second interconnect structure laminated on a second side of the core layer and including second interconnect layers and a single second insulating layer mainly composed of a photosensitive resin, wherein the first interconnect layers are electrically connected to the second interconnect layers via the through interconnect, wherein the core layer has greater rigidity than the first interconnect structure and the second interconnect structure, and wherein a thickness of the second interconnect structure is greater than a thickness of each of the first insulating layer.

8 Claims, 6 Drawing Sheets

FIG.7

INTERCONNECT SUBSTRATE

CROSS-REFERENCE TO RELATED APPLICATIONS

The present application is based on and claims priority to Japanese Patent Application No. 2021-134822 filed on Aug. 20, 2021, with the Japanese Patent Office, the entire contents of which are incorporated herein by reference.

FIELD

The disclosures herein relate to interconnect substrates and methods of making an interconnect substrate.

BACKGROUND

A multilayer interconnect substrate as known in the art has a plurality of interconnect layers and a plurality of insulating layers. As an interconnect substrate of this kind, an interconnect substrate has been proposed that includes a core substrate having a front surface and a back surface, a front interconnect layer formed on the front surface of the core substrate, a build-up layer formed over the front surface of the core substrate, a back interconnect layer formed on the back surface of the core substrate, and a solder resist layer for covering the back interconnect layer, for example. In this interconnect substrate, the core substrate is a single insulating layer made of a glass epoxy resin having a thickness of about 800 μm. The thickness of each insulating layer on the front surface of the core substrate is about 30 μm, and the thickness of the solder resist layer on the back surface of the core substrate is about 25 μm (see Patent Document 1, for example).

Although the above-noted interconnect substrate has been described as being capable of reducing warpage, further reduction of warpage is required.

Accordingly, there may be a need to provide an interconnect substrate for which warpage is further reduced.

RELATED-ART DOCUMENTS

Patent Document

[Patent Document 1] Japanese Patent No. 3786894

SUMMARY

According to an aspect of the embodiment, an interconnect substrate includes a core layer including a resin layer and a through interconnect, the resin layer being mainly composed of a non-photosensitive thermosetting resin, the through interconnect extending through the resin layer, the core layer having no reinforcement member contained therein, a first interconnect structure including a plurality of first interconnect layers and a plurality of first insulating layers mainly composed of a photosensitive resin, the first interconnect structure being laminated on a first side of the core layer, and a second interconnect structure including a plurality of second interconnect layers and a single second insulating layer mainly composed of a photosensitive resin, the second interconnect structure being laminated on a second side of the core layer, wherein the first interconnect layers are electrically connected to the second interconnect layers via the through interconnect, wherein the core layer has greater rigidity than the first interconnect structure and the second interconnect structure, and wherein a thickness of the second interconnect structure is greater than a thickness of each of the first insulating layer.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

In the following, embodiments will be described by referring to the accompanying drawings. In these drawings, the same elements are referred to by the same references, and a duplicate description thereof may be omitted.

First Embodiment

[Structure of Interconnect Substrate]

Figure 1:
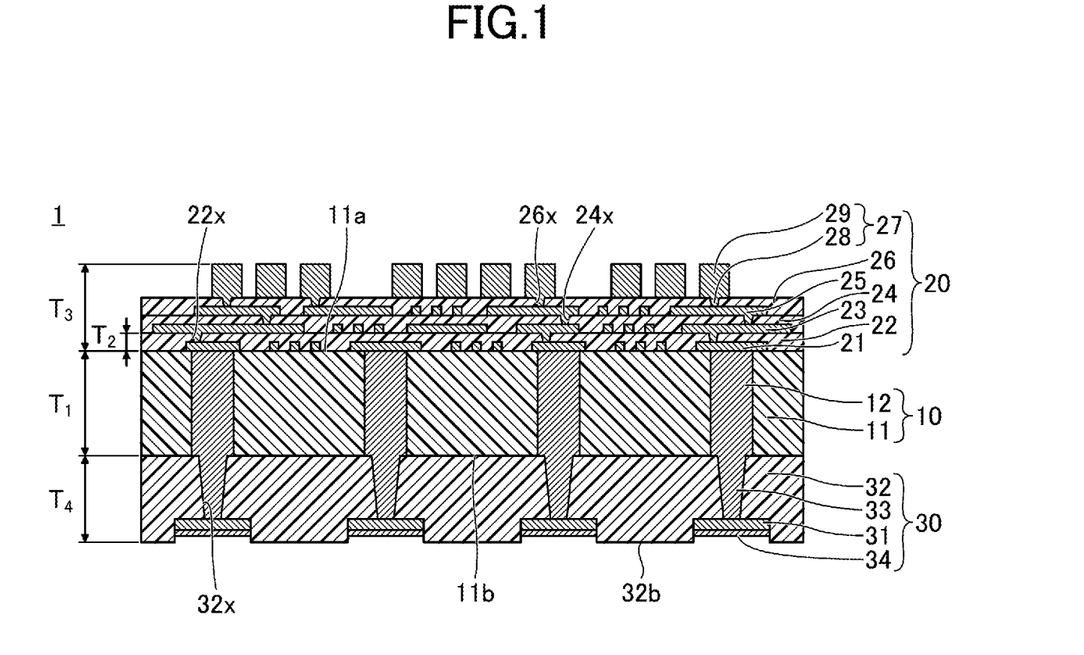
FIG. 1 is a cross-sectional view illustrating an example of an interconnect substrate according to a first embodiment.

In the following, the structure of an interconnect substrate of a first embodiment will be described. FIG. 1 is a cross-sectional view illustrating an example of an interconnect substrate according to the first embodiment.

Referring to FIG. 1, the interconnect substrate 1 according to the first embodiment includes a core layer 10, a first interconnect structure 20 provided on a first side (i.e., upper side in FIG. 1) of the core layer 10 in the thickness direction thereof, and a second interconnect structure 30 provided on the second side (i.e., lower side in FIG. 1) of the core layer 10 in the thickness direction thereof. The plane shape of the interconnect substrate 1 may be square shape or rectangular, for example. This is not a limiting example, and the interconnect substrate 1 may have any plane shape.

The core layer 10 includes a resin layer 11 and a plurality of through interconnects 12, and does not include a reinforcing member such as glass fiber or glass cloth. The through interconnects 12 extend through the resin layer 11 from an upper surface 11a to a lower surface 11b. The plane shape of each of the through interconnects 12 may be a circle having a diameter of approximately 80 to 120 μm, for example. The pitch of the through interconnects 12 may approximately be 90 to 400 μm, for example. Copper (Cu) or the like, for example, may be used as the material of the through interconnects 12.

The upper surface 11a of the resin layer 11 and the upper surfaces of the through interconnects 12 are flush with each other, for example. The upper surface 11a of the resin layer 11 and the upper surfaces of the through interconnects 12 are polished surfaces. Accordingly, the upper surface 11a of the resin layer 11 and the upper surfaces of the through interconnects 12 are smooth surfaces (i.e., low roughness surfaces) having negligible irregularity. The surface roughness Ra of the upper surface 11a of the resin layer 11 and the upper surfaces of the through interconnects 12 are set to be, for example, about 15 to 40 nm. The surface roughness Ra is one type of numerical value representing surface roughness, and is referred to as arithmetic average roughness. Specifically, Ra is the arithmetic average of the absolute values of height deviations that vary in the measurement area as measured from the mean line.

From the viewpoint of reducing the warpage of the interconnect substrate 1, the core layer 10 is preferably more rigid than the first interconnect structure 20 and the second interconnect structure 30. That is, increasing the rigidity of the core layer 10 increases the rigidity of the interconnect substrate 1 as a whole, thereby reducing the warpage of the interconnect substrate 1. Use of a mold resin as a material of the resin layer 11 enables an increase in the rigidity of the core layer 10 without using a reinforcing member. The mold resin is an insulating resin mainly composed of a non-photosensitive thermosetting resin usable in a transfer molding method, a compression molding method, an injection molding method, etc. The mold resin is, for example, an insulating resin such as a non-photosensitive thermosetting epoxy resin, and contains a filler.

The Young's modulus of the resin layer 11 is preferably greater than or equal to 5000 MPa, and preferably less than or equal to 25000 MPa. The Young's modulus of the resin layer 11 can be adjusted, for example, by selecting the type of resin, the type of filler, and the filler content. Examples of the filler contained in the resin layer 11 include silica ($SiO_2$), kaolinite ($Al_2Si_2O_5(OH)_4$), talc ($Mg_3Si_4O_{10}(OH)_2$), and alumina ($Al_2O_3$). Alternatively, two or more of these may be mixed.

The first interconnect structure 20 is comprised of high-density interconnect layers each of which has an interconnect density higher than that of the second interconnect structure 30, and includes an interconnect layer 21, an insulating layer 22, an interconnect layer 23, an insulating layer 24, an interconnect layer 25, an insulating layer 26, and an interconnect layer 27. The second interconnect structure 30 is comprised of low-density interconnect layers each of which has an interconnect density lower than that of the first interconnect structure 20, and includes an interconnect layer 31, an insulating layer 32, and an interconnect layer 33.

In the present embodiment, for the sake of convenience, the side of the interconnect substrate 1 on which the insulating layer 26 is situated is referred to as an upper side or a first side, and the side on which the insulating layer 32 is situated is referred to as a lower side or a second side. A surface (or face) of a given member that faces toward the upper side is referred to as a first surface (or first face) or an upper surface (or upper face), and a surface (or face) of the given member that faces toward the lower side is referred to as a second surface (or second face) or a lower surface (or lower face). It may be noted, however, that the interconnect substrate 1 may be used in an upside-down position, or may be placed at any angle. Further, a plan view refers to a view taken in the direction perpendicular to the upper surface 11a of the resin layer 11, and a plane shape refers to the shape of an object as viewed in the direction perpendicular to the upper surface 11a of the resin layer 11.

The interconnect layer 21 is formed on the upper surface 11a of the resin layer 11. The interconnect layer 21 includes interconnects (i.e., interconnect patterns and pads) electrically connected to the interconnect layer 31 via the through interconnects 12 and the interconnect layer 33. That is, part of the lower surface of the interconnect layer 21 is in contact with the upper surfaces of the through interconnects 12, and these are electrically connected to each other. Copper (Cu) or the like may be used as the material of the interconnect layer 21, for example. The interconnect layer 21 may be a laminate film in which a plurality of conductive layers are laminated.

The interconnect layer 21 has an interconnect density higher than (i.e., line width and space narrower than) that of the interconnect layer 31, and is thinner than that of the interconnect layer 31. In the present specification, an interconnect layer having a line width and space of 8 μm and 8 μm or less is defined as an interconnect layer having a high interconnect density. The line width and space of the interconnect layer 21 may range approximately from 1 μm and 1 μm, respectively, to 3 μm and 3 μm, respectively, for example. The thickness of the interconnect layer 21 may be about 1 to 3 μm, for example.

The term "line width" in the phrase "line width and space" refers to the width of each interconnect, and the term "space" refers to the gap (i.e., interval) between immediately adjacent interconnects. The statement that the line width and space are 2 μm and 2 μm, respectively means that the width of each interconnect is 2 μm, and, also, the interval between immediately adjacent interconnects is 2 μm.

The insulating layer 22 is one which is mainly composed of a photosensitive resin. The phrase "mainly composed of a photosensitive resin" means that one or more other components such as a filler may be contained in addition to the photosensitive resin. For example, the insulating layer 22 may contain a filler such as silica ($SiO_2$).

The insulating layer 22 is formed on the upper surface 11a of the resin layer 11 to cover the interconnect layer 21. Examples of the photosensitive resin used for the insulating layer 22 include an insulating resin such as a phenolic resin or a polyimide resin.

The interconnect layer 23 is formed on the first side of the insulating layer 22 and electrically coupled to the interconnect layer 21. The interconnect layer 23 includes via interconnects that fill via holes 22x extending through the insulating layer 22 to expose the upper surface of the interconnect layer 21, and also includes interconnect patterns formed on the upper surface of the insulating layer 22. The shape of the via holes 22x may be a frustum of an inverted right circular cone for which the diameter of an opening of the hole toward the insulating layer 24 is greater than the diameter of a bottom opening of the hole at the upper surface of the interconnect layer 21. The diameter of the openings of the via holes 22x may be, for example, about 10 to 20 μm. The material of the interconnect layer 23 and the thickness of the interconnect patterns of the interconnect layer 23 may be substantially the same as those of the interconnect layer 21, for example.

The line width and space of the interconnect layer 23 may range approximately from 1 μm and 1 μm, respectively, to 3 μm and 3 μm, respectively, for example, but may be set to be narrower than those of the interconnect layer 21. That is, the upper surface 11a of the resin layer 11 is a polished surface, and is smoother than the lower surface 11b of the resin layer 11. The upper surface of the insulating layer 22 mainly composed of a photosensitive resin is smoother than the upper surface 11a of the resin layer 11 that is mainly composed of a non-photosensitive thermosetting resin. Because of this, the line width and space of the interconnect layer 23 can be set to be narrower than those of the interconnect layer 21. For example, the line width and space of the interconnect layer 21 may be set to 3 μm and 3 μm, respectively, and the line width and space of the interconnect layer 23 may be set to 1 μm and 1 μm, respectively. The same applies to the interconnect layer 25, which will be described later.

The insulating layer 24 is formed on the first surface of the insulating layer 22 to cover the interconnect layer 23. The material of the insulating layer 24 may be substantially the same as that of the insulating layer 22. The insulating layer 24 may contain a filler such as silica ($SiO_2$).

The interconnect layer 25 is formed on the first side of the insulating layer 24, and is electrically coupled to the interconnect layer 23. The interconnect layer 25 includes via interconnects that fill via holes 24x extending through the insulating layer 24 to expose the upper surface of the interconnect layer 23, and also includes interconnect patterns formed on the upper surface of the insulating layer 24. The shape of the via holes 24x may be a frustum of an inverted right circular cone for which the diameter of an opening of the hole toward the insulating layer 26 is greater than the diameter of a bottom opening of the hole at the upper surface of the interconnect layer 23. The diameter of the openings of the via holes 24x may be, for example, about 10 to 20 μm. The material of the interconnect layer 25 and the thickness of the interconnect patterns of the interconnect layer 25 may be substantially the same as those of the interconnect layer 21, for example. The line width and space of the interconnect patterns of the interconnect layer 25 may be substantially the same as those of the interconnect layer 23, for example.

The insulating layer 26 is formed on the first surface of the insulating layer 24 to cover the interconnect layer 25. In the first interconnect structure 20, the insulating layer 26 is the uppermost insulating layer. The material of the insulating layer 26 may be substantially the same as that of the insulating layer 22. The insulating layer 26 may contain a filler such as silica ($SiO_2$).

The interconnect layer 27 is formed on the first side of the insulating layer 26. In the first interconnect structure 20, the interconnect layer 27 is the uppermost interconnect layer. The interconnect layer 27 includes via interconnects 28 that fill via holes 26x extending through the insulating layer 26 to expose the upper surface of the interconnect layer 25, and also includes pads 29 protruding on the upper surface of the insulating layer 26. The shape of the via holes 26x may be a frustum of an inverted right circular cone for which the diameter of an opening of the hole toward the pads 29 is greater than the diameter of a bottom opening of the hole at the upper surface of the interconnect layer 25. The diameter of the openings of the via holes 26x may be, for example, about 10 to 20 μm.

The material of the interconnect layer 27 may be, for example, substantially the same as that of the interconnect layer 21. The thickness of the interconnect layer 27 (i.e., the sum of the thickness of the via interconnects 28 and the thickness of the pads 29) may be, for example, about 10 to 20 μm. The thickness of the pads 29 (the length from the upper surface of the insulating layer 26 to the upper surface of the pads 29) may be, for example, about 5 to 10 μm. The plane shape of the pads 29 may be a circle having a diameter of approximately 20 to 30 μm, for example. The pitch of the pads 29 may approximately be 40 to 50 μm, for example. The pads 29 may be used as external connection terminals for electrical connection with a semiconductor chip.

A surface treatment layer may be formed only on the upper surface of the pads 29 or on the upper surface and side surface of the pads 29. Examples of the surface treatment layer may include an Au layer, an Ni/Au layer (i.e., a metal layer in which an Ni layer and an Au layer are laminated in this order), an Ni/Pd/Au layer (i.e., a metal layer in which an Ni layer, a Pd layer, and an Au layer are laminated in this order), and the like. Anti-oxidizing treatment such as OSP (i.e., organic solderability preservative) treatment or the like may be applied only on the upper surface of the pads 29 or on the upper surface and side surface of the pads 29.

The interconnect layer 31 is the lowermost interconnect layer exposed at the lower surface 32b of the insulating layer 32, and has an upper surface and a side surface thereof covered with the insulating layer 32. The lower surface of the interconnect layer 31 is exposed, for example, at a position recessed from the lower surface 32b of the insulating layer 32 toward the interconnect layer 33. Alternatively, the lower surface of the interconnect layer 31 may be flush with the lower surface 32b of the insulating layer 32 according to need. Alternatively, the lower surface and part of the side surface of the interconnect layer 31 may protrude downwardly from the lower surface 32b of the insulating layer 32.

The interconnect layer 31 may be comprised of, for example, pads each having a circular plane shape with a diameter of about 150 μm, and may further include interconnect patterns. An interval between two adjacent portions of the interconnect layer 31 may approximately be 200 μm, for example. Copper (Cu) or the like may be used as the material of the interconnect layer 31, for example. The thickness of the interconnect layer 31 may be about 10 to 20 μm, for example. The interconnect layer 31 may be used as external connection terminals (i.e., pads) for electrical connection with another interconnect substrate.

A surface treatment layer 34 may be provided on the lower surface of the interconnect layer 31 exposed at the lower surface 32b of the insulating layer 32. An example of the surface treatment layer 34 may be substantially the same as the surface treatment layer that may be provided on the pads 29.

The insulating layer 32 is a single insulating layer covering the upper surface and side surface of the interconnect layer 31. Like the insulating layer 22, the insulating layer 32 is mainly composed of a photosensitive resin. The insulating layer 32 may contain a filler such as silica ($SiO_2$).

The interconnect layer 33 is via interconnects arranged in the insulating layer 32. More specifically, the interconnect layer 33 is via interconnects that fill via holes 32x extending through the insulating layer 32 to expose the upper surface of the interconnect layer 31, and electrically connects the interconnect layer 31 (i.e., pads) and the through interconnects 12. The interconnect layer 33 may be formed with each of the through interconnects 12 as a single seamless piece. When the interconnect layer 33 and each of the through interconnects 12 are formed as a single seamless piece, there is no interface therebetween. The material of the interconnect layer 33 may be, for example, substantially the same as that of the through interconnects 12.

The shape of the via holes 32x may be a frustum of an inverted right circular cone for which the diameter of an opening of the hole toward the resin layer 11 is greater than the diameter of a bottom opening of the hole at the upper surface of the interconnect layer 31. The diameter of the openings of the via holes 32x may be, for example, about 60 to 70 μm. In other words, in the cross-sectional view, the width of the interconnect layer 33 increases with the distance from the interconnect layer 31 toward the through interconnects 12. In the cross-sectional view, further, the width of the interconnect layer 33 at the point of contact with the through interconnects 12 is narrower than the width of the through interconnects 12 at the point of contact with the interconnect layer 33.

From the viewpoint of reducing the warpage of the interconnect substrate 1, the thickness $T_1$ of the core layer 10 is preferably greater than the thickness $T_3$ of the first interconnect structure 20 and the thickness 14 of the second interconnect structure 30. The thickness $T_1$ of the core layer 10 may be greater than or equal to 100 μm and less than or equal to 300 μm, for example. However, from the viewpoint of restriction imposed during the molding of the resin layer 11 and reduction of the height of the interconnect substrate 1, the thickness $T_1$ of the core layer 10 is preferably greater than or equal to 100 μm and less than or equal to 200 μm. The thickness $T_3$ of the first interconnect structure 20 may be greater than or equal to 20 μm and less than or equal to 40 μm, for example. The thickness $T_4$ of the second interconnect structure 30 may be greater than or equal to 5 μm and less than or equal to 40 μm, for example.

The thickness $T_1$ of the core layer 10 is the distance from the lower surface 11b of the resin layer 11 to the upper surface 11a. The thickness $T_3$ of the first interconnect structure 20 is the distance from the lower surface of the insulating layer 22 to the upper surface of the pads 29. The thickness $T_4$ of the second interconnect structure 30 is the distance from the lower surface 32b of the insulating layer 32 to the upper surface of the insulating layer 32.

The thickness $T_2$ of each of the insulating layers 22, 24, and 26 constituting the first interconnect structure 20 is, for example, greater than equal to 5 μm and less than or equal to 10 μm. From the viewpoint of reducing the warpage of the interconnect substrate 1, the thickness 14 of the second interconnect structure 30 is preferably greater than the thickness 12 of each insulating layer constituting the first interconnect structure 20. For example, in the case in which the thickness $T_2$ of each of the insulating layers 22, 24, and 26 is 5 μm, the thickness 14 of the second interconnect structure 30 is preferably greater than 5 μm. For example, in the case in which the thickness 12 of each of the insulating layers 22, 24, and 26 is 10 μm, the thickness 14 of the second interconnect structure 30 is preferably greater than 10 μm. The thickness $T_3$ of the first interconnect structure 20 may be substantially equal to the thickness 14 of the second interconnect structure 30. Here, the phrase "substantially equal" means that the thickness $T_3$ of the first interconnect structure 20 is between 20% lower than the thickness 14 of the second interconnect structure 30 and 20% higher than the thickness 14 of the second interconnect structure 30, inclusive.

From the viewpoint of reducing warpage of the interconnect substrate 1, the thermal expansion coefficient of the resin layer 11 is preferably less than both the thermal expansion coefficient of the insulating layers constituting the first interconnect structure 20 (i.e., the insulating layers 22, 24, and 26) and the thermal expansion coefficient of the insulating layer 32 constituting the second interconnect structure 30. From the viewpoint of reducing warpage of the interconnect substrate 1, the thermal expansion coefficient of the insulating layers constituting the first interconnect structure 20 (i.e., the insulating layers 22, 24, and 26) is preferably substantially equal to the thermal expansion coefficient of the insulating layer 32 constituting the second interconnect structure 30. Here, the phrase "substantially equal" means that the thermal expansion coefficient of the insulating layers constituting the first interconnect structure 20 (i.e., the insulating layers 22, 24, and 26) is between 20% lower than the thermal expansion coefficient of the insulating layer 32 constituting the second interconnect structure 30 and 20% higher than the thermal expansion coefficient of the insulating layer 32 constituting the second interconnect structure 30, inclusive.

The thermal expansion coefficient of the resin layer 11 may be greater than or equal to 5 ppm/° C. and less than or equal to 20 ppm/° C., for example. The thermal expansion coefficient of the insulating layers constituting the first interconnect structure 20 (i.e., insulating layers 22, 24, and 26) and the thermal expansion coefficient of the insulating layer 32 constituting the second interconnect structure 30 may be, for example, greater than or equal to 40 ppm/° C. and less than or equal to 60 ppm/° C. The thermal expansion coefficient of each insulating layer may be adjusted to a predetermined value by selecting the content of a filler, the composition of an insulating resin, or the like, for example.

[Method of Making Interconnect Substrate of First Embodiment]

In the following, a method of making the interconnect substrate of the first embodiment will be described. FIGS. 2A to 2C, FIGS. 3A to 3C, and FIGS. 4A and 4B are drawings illustrating an example of the process of making the interconnect substrate of the first embodiment. This embodiment is directed to the process steps of making a single interconnect substrate. Alternatively, however, a plurality of structures to serve as respective interconnect substrates may be made as a single piece, followed by being separated into respective interconnect substrates. Although the disclosed example is directed to the process steps of forming a layered structure only on the first side of the support member, the process steps may alternatively be such that layered structures are formed on the first side and second side of the support member.

Figure 2A:
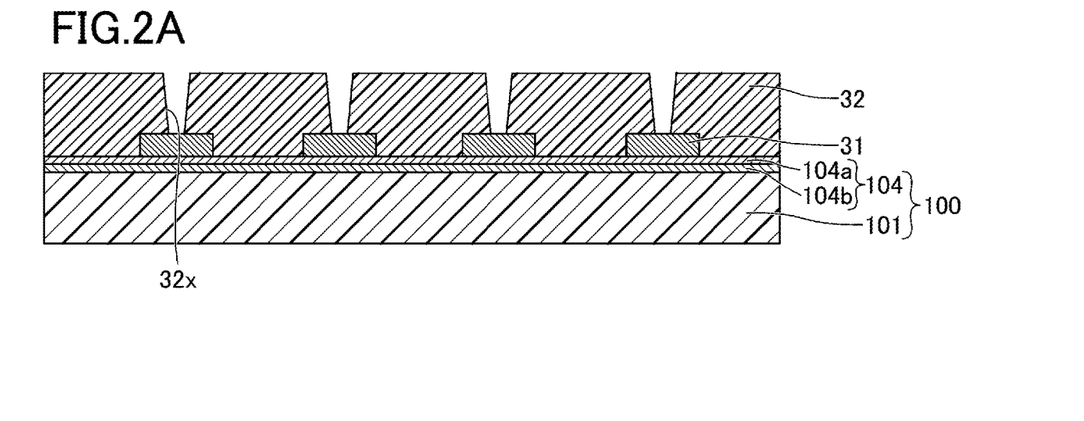
FIGS. 2A through 2C are drawings illustrating an example of steps of making the interconnect substrate according to the first embodiment.

In the step illustrated in FIG. 2A, a support member 100 is put in place, and, then, an interconnect layer 31 and an insulating layer 32 are formed on the support member 100, followed by forming via holes 32x in the insulating layer 32. The support member 100 has a structure in which a copper foil 104 with a carrier is laminated on the first side of a core substrate 101, for example. The core substrate 101 is, for example, a resin substrate having a thickness of about 0.7 mm, and may contain a reinforcing member such as glass fiber. The copper foil 104 with a carrier includes a thick copper foil (i.e., carrier foil) 104b having a thickness of approximately 10 to 50 μm and a thin copper foil 104a having a thickness of approximately 1.5 to 5 μm, which is attached to the thick copper foil via a release layer (not shown) in a releasable manner. The thick foil 104b serves as a support body for providing easy handling of the thin foil 104a.

The structure of the support member 100 is only an example, and is non-limiting. For example, the support member 100 may be configured such that a laminate made by laminating a plurality of prepregs may be used in place of the core substrate 101. The support member 100 may be structured such that a copper foil 104 with a carrier is disposed on one side of a glass substrate, a metal substrate, or the like via a release layer.

After the support member 100 is put in place, the interconnect layer 31 is formed on the first side of the support member 100. Specifically, on the upper surface of the copper foil 104 with a carrier (i.e., on the upper surface of the thin foil 104*a*), a dry film resist or the like is used to form a resist layer that has openings at portions where the interconnect layer 31 is to be formed. Electrolytic plating is then performed using the copper foil 104 with a carrier as a power feed layer to form an electrolytic plating layer as the interconnect layer 31 on the portions, exposed in the openings, of the upper surface of the copper foil 104 with a carrier. The material and thickness of the interconnect layer 31 are the same as those previously described. Subsequently, the resist layer is removed.

A photosensitive resin in a liquid or paste form is applied to the upper surface of the copper foil 104 with a carrier so as to cover the interconnect layer 31, followed by applying heat at a temperature that does not cause curing, thereby forming a semi-cured insulating layer 32. The material and thickness of the insulating layer 32 are the same as those previously described. Photolithography, for example, is used to form via holes 32*x* for exposing the interconnect layer 31 through the insulating layer 32. Thereafter, the insulating layer 32 is heated and cured at a curing temperature or higher.

Figure 2B:
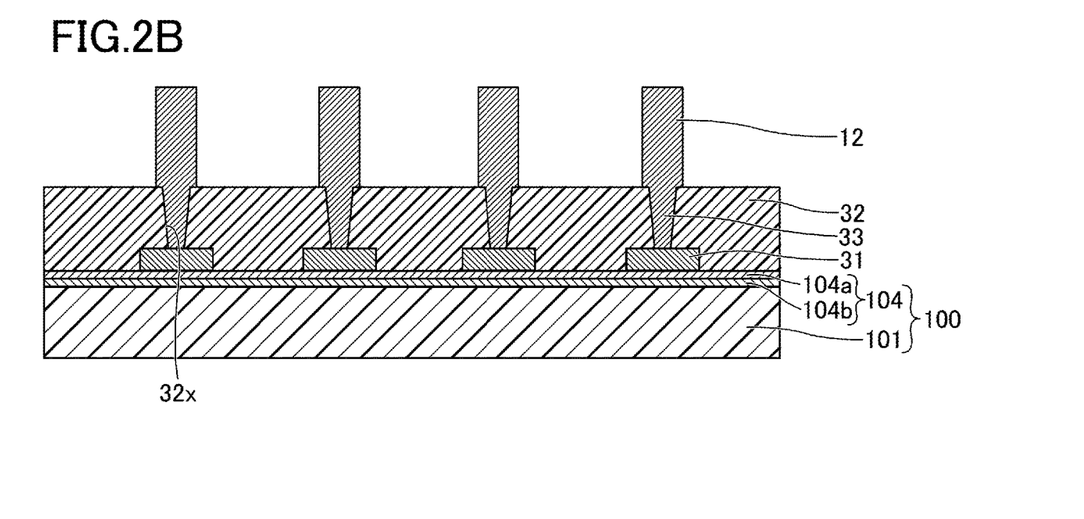

In the step illustrated in FIG. 2B, an interconnect layer 33 serving as via interconnects is formed and fill the via holes 32*x*. Further, through interconnects 12 protruding from the upper surface of the insulating layer 32 is each formed integrally with the interconnect layer 33 as one seamless piece. The interconnect layer 33 and the through interconnects 12 may be formed continuously by using, for example, a semi-additive method. Specifically, a seed layer is formed by an electroless plating method or a sputtering method on the upper surface of the insulating layer 32, the inner wall surface of the via holes 32*x*, and the upper surface of the interconnect layer 31 exposed in the via holes 32*x*.

A photosensitive resist layer is formed over the entire seed layer. The resist layer is then exposed and developed to form openings that expose the portions where the interconnect layer 33 and the through interconnects 12 are to be formed. Electrolytic plating is performed by using the seed layer as a power feed layer to form the electroplating layer on the portions of the seed layer that are exposed in the openings. The resist layer is detached, and, then, the electroplating layer is used as a mask to etch and remove the seed layer at the places not covered with the electroplating layer. With this arrangement, the interconnect layer 33 and the through interconnects 12 including the seed layer and the electroplating layer laminated thereon are continuously formed. The material and the like of the interconnect layer 33 and the through interconnects 12 are the same as those previously described. Although the interconnect layer 33 and the through interconnects 12 have a laminated structure having an electrolytic plating layer is laminated on the seed layer, the distinction between the seed layer and the electrolytic plating layer is not shown in FIG. 2B and the like (the same omission may also be applied to other interconnect layers in some cases).

Figure 2C:
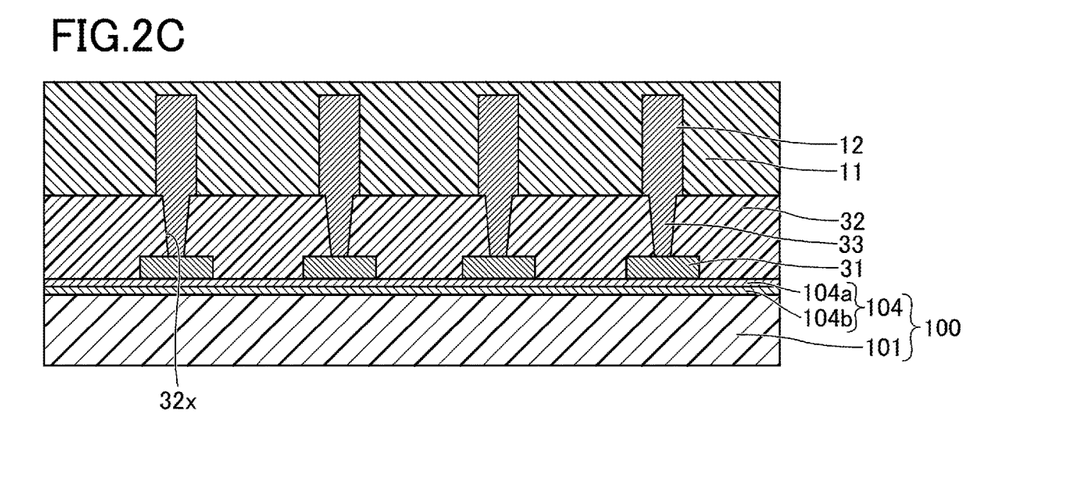

In the step illustrated in FIG. 2C, a resin layer 11 containing no reinforcing member is formed on the insulating layer 32 to cover the upper surface and side surface of the through interconnects 12. The resin layer 11 can be formed, for example, by a molding method using a molding resin. For example, the structure illustrated in FIG. 2B is placed in a mold, and a mold resin in fluid form is injected into the mold by applying pressure (for example, 5 to 10 MPa). Thereafter, the mold resin is heated at a temperature of approximately 180° C. and cured to form the resin layer 11. After the required sealing process is completed, the structure covered with the resin layer 11 is taken out of the mold. A transfer molding method, a compression molding method, an injection molding method, or the like, for example, may be used as the molding method.

Figure 3A:
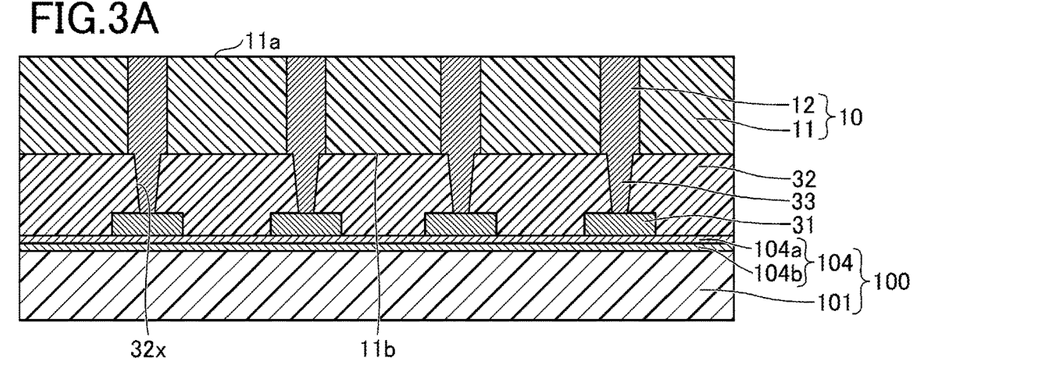
FIGS. 3A through 3C are drawings illustrating an example of steps of making the interconnect substrate according to the first embodiment.

In the step illustrated in FIG. 3A, the upper surface 11*a* of the resin layer 11 illustrated in FIG. 2C is polished to expose the upper surface of the through interconnects 12. Polishing of the resin layer 11 may be performed by using a chemical mechanical polishing (CMP) method, for example. The upper surface of the through interconnects 12 may be made flush with the upper surface 11*a* of the resin layer 11, for example. Upon completion of this step, the core layer 10 having the resin layer 11 and the through interconnects 12 is obtained.

In conjunction with the polishing of the resin layer 11, the upper surface of the through interconnects 12 may also be polished and removed. This makes it possible to reduce the roughness of the upper surface 11*a* of the resin layer 11 and the upper surface of the through interconnects 12. That is, the smoothness of the upper surface 11*a* of the resin layer 11 and the upper surface of the through interconnects 12 may be improved. The roughness Ra of the upper surface 11*a* of the resin layer 11 and the upper surface of the through interconnects 12 after polishing may be, for example, about 15 to 40 nm. As described above, the roughness of the upper surface 11*a* of the resin layer 11 and the upper surface of the through interconnects 12 is reduced to improve the smoothness, which allows extremely fine interconnects (i.e., an interconnect layer with high-density interconnects) to be formed in a subsequent process step. The roughness Ra of the lower surface 11*b* of the resin layer 11 is, for example, about 180 to 280 nm.

Figure 3B:
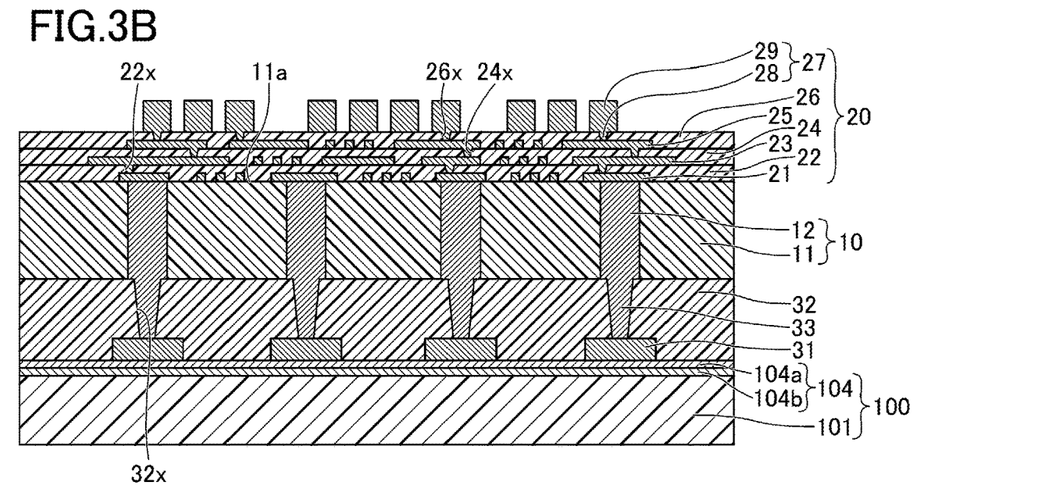

In the step illustrated in FIG. 3B, the first interconnect structure 20 is laminated on the core layer 10 (i.e., on the upper surface 11*a* of the resin layer 11 and the upper surface of the through interconnects 12). First, an interconnect layer 21 having a predetermined pattern is formed on the upper surface 11*a* of the resin layer 11 and the upper surface of the through interconnects 12. The interconnect layer 21 may be formed by using, for example, a semi-additive method. About the semi-additive method, the previous description may be referred to. Next, a photosensitive resin in a liquid or paste form is applied to the upper surface 11*a* of the resin layer 11 to cover the interconnect layer 21, followed by applying heat at a temperature that does not cause curing, thereby forming a semi-cured insulating layer 22. The material and thickness of the insulating layer 22 are the same as those previously described. Photolithography, for example, is used to form via holes 22*x*, and, then, the insulating layer 22 is heated and cured at a curing temperature or higher. The upper surface of the insulating layer 22 mainly composed of the photosensitive resin is smoother than the upper surface 11*a* of the resin layer 11. The roughness Ra of the upper surface of the insulating layer 22 may be, for example, about 2 to 6 nm.

Subsequently, an interconnect layer 23, an insulating layer 24, an interconnect layer 25, and an insulating layer 26 are formed by repeating the substantially same steps as described above, and, then, an interconnect layer 27 including via interconnects 28 and pads 29 is formed. The via interconnects 28 and the pads 29 may be formed in the same manner as the interconnect layer 33 and the through interconnects 12, for example. The materials and thicknesses of the interconnect layer 23, the insulating layer 24, the interconnect layer 25, the insulating layer 26, and the interconnect layer 27 are the same as those previously described.

Figure 3C:
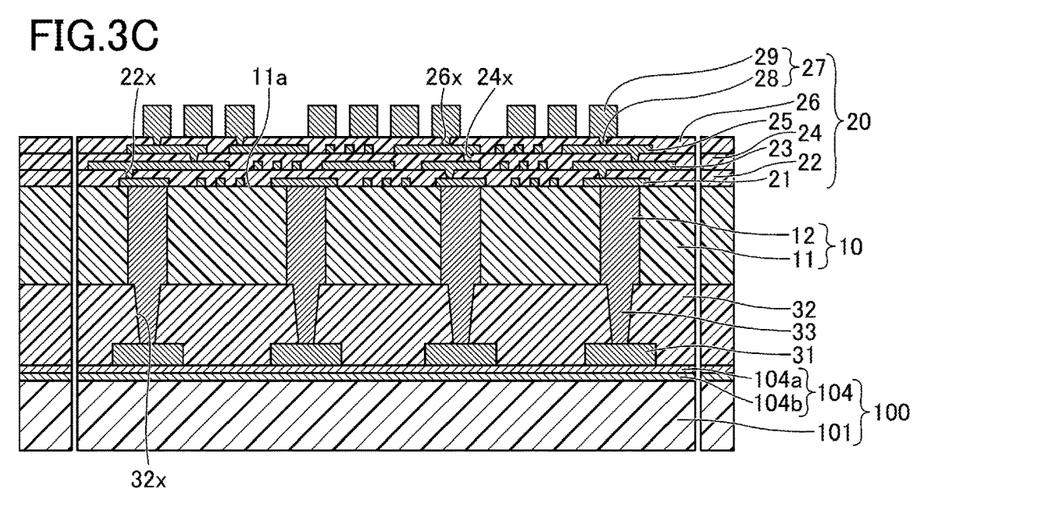

In the step illustrated in FIG. 3C, the outer perimeter portion of the entire structure illustrated in FIG. 3B is cut by using a dicing blade or the like. In the step illustrated in FIG. 4A, the support member 100 illustrated in FIG. 3C is removed. In order to remove the support member 100, the core substrate 101 and the thick foil 104b are mechanically separated from the thin foil 104a. Then, the thin foil 104a is removed by wet etching using a ferric chloride solution, a copper chloride solution, an ammonium persulfate solution, or the like, for example. At this time, in the case in which the interconnect layer 31 is made of copper, the lower surface of the interconnect layer 31 is also etched, and the lower surface of the interconnect layer 31 is recessed from the lower surface 32b of the insulating layer 32 toward the interconnect layer 33.

Figure 4A:
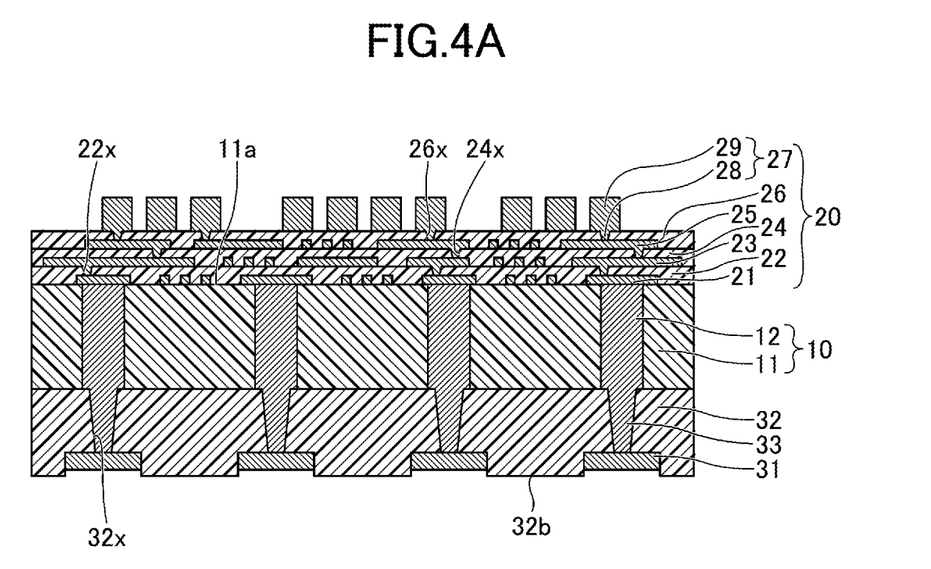
FIGS. 4A and 4B are drawings illustrating an example of steps of making the interconnect substrate according to the first embodiment.
Figure 4B:
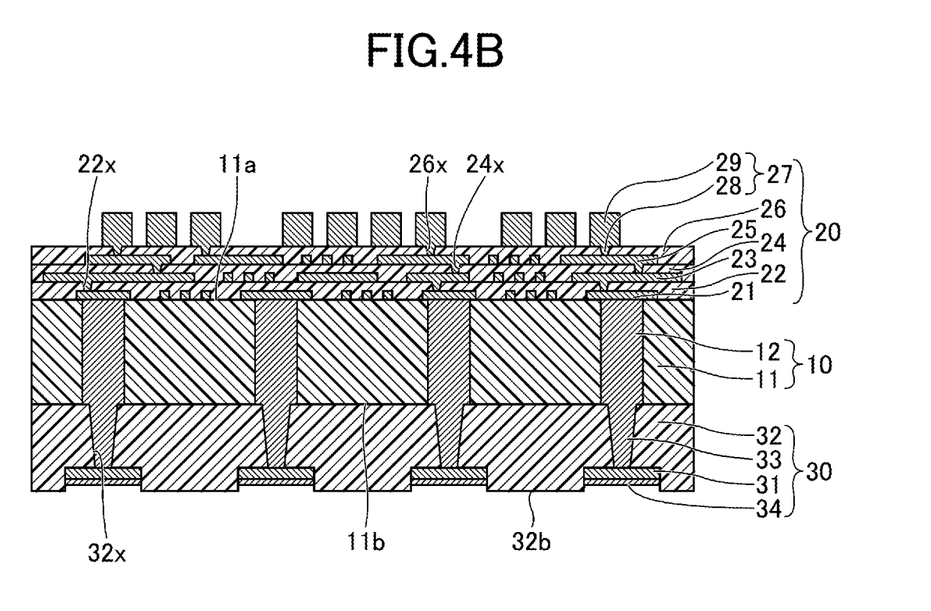

In the step illustrated in FIG. 4B, a surface treatment layer 34 is formed on the lower surface of the interconnect layer 31 of the structure illustrated in FIG. 4A according to need. With this, the interconnect substrate 1 is completed in final form. The surface treatment layer 34 may be, for example, a metal layer or a laminate of metal layers as previously described formed by an electroless plating method, or may be formed by applying an antioxidant treatment such as an OSP treatment. A surface treatment layer similar to the surface treatment layer 34 may be formed only on the upper surface of the pads 29 or on the upper surface and side surface of the pads 29.

As described above, the interconnect substrate 1 is configured such that the core layer 10 having a high rigidity has a first side thereof on which the first interconnect structure 20 having a lower rigidity than that of the core layer 10 is laminated, and has a second side thereof on which the second interconnect structure 30 having a lower rigidity than that of the core layer 10 is laminated. The thickness $T_4$ of the second interconnect structure 30 having a smaller number of insulating layers than the first interconnect structure 20 is greater than the thickness $T_2$ of each of the insulating layers constituting the first interconnect structure 20. This structure makes it possible to approximate a structure symmetrical in the vertical direction (i.e., in the thickness direction) with the highly rigid core layer 10 as the center of symmetry, thereby enabling the reduction of warpage of the interconnect substrate 1.

From the viewpoint of reducing the warpage of the interconnect substrate 1, the thickness $T_1$ of the core layer 10 is preferably greater than the thickness $T_3$ of the first interconnect structure 20 and the thickness $T_4$ of the second interconnect structure 30, and is preferably greater than or equal to 100 μm and less than or equal to 200 μm. From the viewpoint of reducing the warpage of the interconnect substrate 1, the thickness $T_3$ of the first interconnect structure 20 is preferably substantially equal to the thickness $T_4$ of the second interconnect structure 30. In the first interconnect structure 20, the total thickness of the layers including the insulating layers 22, 24, and 26 and excluding the pads 29 is smaller than the thickness 14 of the second interconnect structure 30.

In the interconnect substrate 1, the core layer 10 does not include a reinforcing member. That is, the resin layer 11 used in the step of FIG. 2C does not include a reinforcing member. Because of this, the through interconnects 12 may easily be covered with the resin layer 11 in the step of FIG. 2C. It may be noted that use of a mold resin as a material of the resin layer 11 enables an increase in the rigidity of the core layer 10 without using a reinforcing member.

In the interconnect substrate 1, the thermal expansion coefficient of the resin layer 11 may be greater than or equal to 5 ppm/° C. and less than or equal to 20 ppm/° C. The thermal expansion coefficient of the insulating layers 22, 24, and 26 constituting the first interconnect structure 20 and the thermal expansion coefficient of the insulating layer 32 constituting the second interconnect structure 30 may each be greater than or equal to 40 ppm/° C. and less than or equal to 60 ppm/° C. With this arrangement, the imbalance of thermal expansion coefficients in the vertical direction (i.e., in the thickness direction) with the core layer 10 at the center is improved, which enables the reduction of warpage of the interconnect substrate 1.

Further, reducing the warpage of the interconnect substrate 1 makes it easier to mount a semiconductor chip on one side of the interconnect substrate 1 where the interconnect layer 27 is situated, or to mount the interconnect substrate 1 on another interconnect substrate.

It may be noted that the structure illustrated in FIG. 3B may serve as a product for shipment. That is, the interconnect substrate 1 with the support member 100 attached thereto may be shipped.

<Simulation of Warpage>

[First Simulation]

Figure 5:
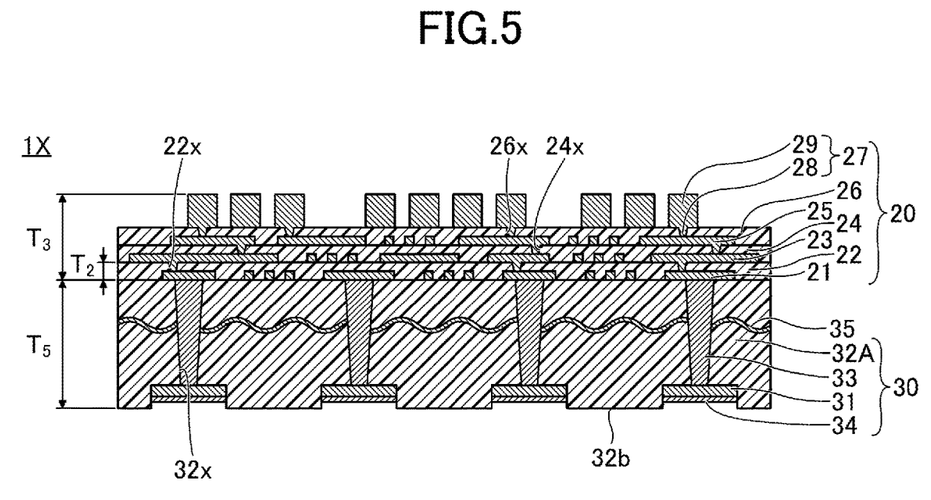
FIG. 5 is a cross-sectional view illustrating an example of an interconnect substrate according to a comparative example.

FIG. 5 is a cross-sectional view illustrating an example of an interconnect substrate according to a comparative example. An interconnect substrate 1X illustrated in FIG. 5 differs from the interconnect substrate 1 in that the core layer 10 is not provided, and in that an insulating layer 32A made of a non-photosensitive thermosetting resin and having a glass cloth as a reinforcement member 35 is provided. A first simulation was conducted to simulate warpage that would remain after the interconnect substrate 1 and the interconnect substrate 1X were heated to 180° C. and then returned to room temperature. The conditions of the first simulation are shown in TABLE 1. In the interconnect substrate 1 and the interconnect substrate 1X, the thermal expansion coefficient of the insulating layers 22, 24, and 26 was set to 40 ppm/° C. In the interconnect substrate 1, the thermal expansion coefficient of the insulating layer 32 was set to 13.8 ppm/° C. In the interconnect substrate 1X, the thermal expansion coefficient of the insulating layer 32A was set to 12.7 ppm/° C.

TABLE 1

|  |  | INTERCONNECT SUBSTRATE 1 | INTERCONNECT SUBSTRATE 1X |
|---|---|---|---|
| SIZE (PLAN VIEW) |  | 50 mm × 50 mm | 50 mm × 50 mm |
| THICKNESS | $T_1$ | 100 μm | — |
|  | $T_2$ | 7.0 μm | 7.0 μm |
|  | $T_3$ | 30 μm | 30 μm |
|  | $T_4$ | 12 μm | — |
|  | $T_5$ | — | 70 μm |

Figure 6:
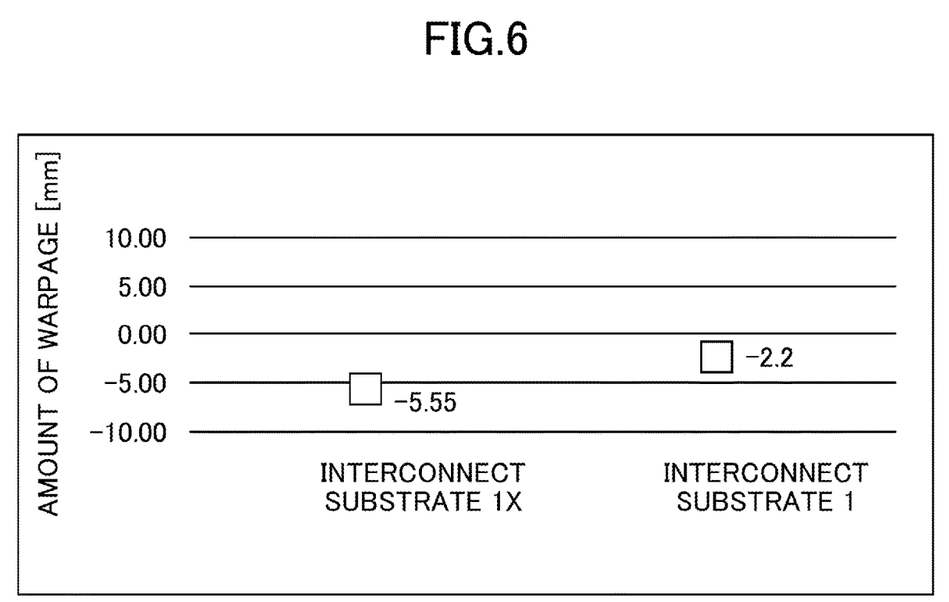
FIG. 6 is a drawing illustrating the results of a first simulation.

The results of the first simulation are shown in FIG. 6. As illustrated in FIG. 6, the interconnect substrate 1X warped such that the surface on the interconnect layer 31 side had a convex warped surface, with the amount of warpage being −5.55 mm. In contrast, the interconnect substrate 1 warped such that the surface the interconnect layer 31 side had a convex warped surface, with the amount of warpage being −2.20 mm. That is, it was confirmed that the structure of the interconnect substrate 1 achieved a reduction in the amount of warpage such that the absolute value thereof became 1/2 or less of j that of the interconnect substrate 1X. Here, the amount of warpage is defined as the distance in the vertical direction between the highest point on the uppermost surface and the lowest point on the uppermost surface when the interconnect substrate is placed on a horizontal flat plane.

The minus sign indicates that the direction of warpage is such that the surface on the interconnect layer 31 side has a convex warped surface.

[Second Simulation]

In the second simulation, a change in the amount of warpage was examined when the thickness $T_1$ of the core layer 10 and the thickness $T_4$ of the second interconnect structure 30 were changed in the interconnect substrate 1 illustrated in TABLE 1.

TABLE 2

| | WARPAGE [mm] | | |
|---|---|---|---|
| $T_1$ [μm] | $T_4 = 5$ μm | $T_4 = 10$ μm | $T_4 = 15$ μm |
| 30 | −6.6 | 6.0 | 12.8 |
| 40 | −7.7 | 2.8 | 9.1 |
| 50 | −8.0 | 0.7 | 6.4 |
| 100 | −6.4 | −2.2 | 1.0 |
| 150 | −4.7 | −2.3 | −0.3 |
| 200 | −3.6 | −2.0 | −0.6 |
| 250 | −2.8 | −1.7 | −0.6 |
| 300 | −2.3 | −1.4 | −0.6 |

Figure 7:
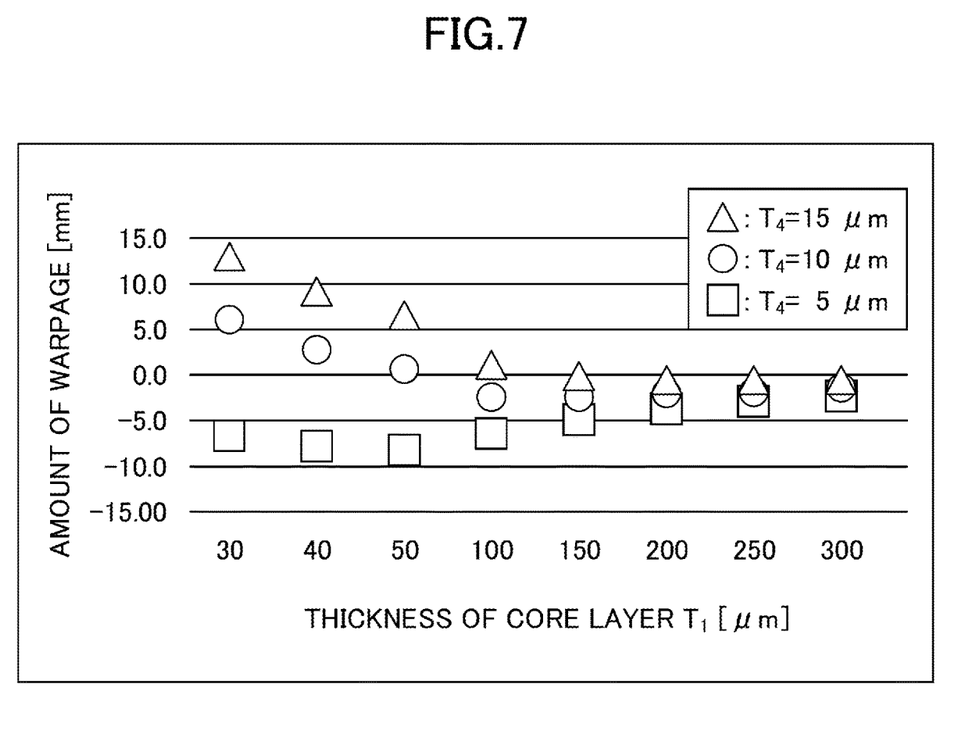
FIG. 7 is a drawing illustrating the results of a second simulation.

The results of the second simulation are shown in TABLE 2 and FIG. 7. As can be seen from TABLE 2 and FIG. 7, the absolute value of the amount of warpage was reduced to ½ or less of that of the interconnect substrate 1X illustrated in TABLE 1 when the thickness $T_1$ of the core layer 10 was 100 μm or more and 300 μm or less and the thickness $T_4$ of the second interconnect structure 30 was greater than the thickness $T_2$ of each of the insulating layers 22, 24, and 26.

Further, as can be seen from TABLE 2 and FIG. 7, the absolute value of the amount of warpage was reduced to ⅕ or less of that of the interconnect substrate 1X illustrated in TABLE 1 when the thickness $T_1$ of the core layer 10 was 100 μm or more and 300 μm or less and the thickness $T_4$ of the second interconnect structure 30 was approximately twice the thickness $T_2$ of each of the insulating layers 22, 24, and 26. Substantially the same results are expected to be obtained when the thickness $T_1$ of the core layer 10 is 100 μm or more and 300 μm or less and the thickness 14 of the second interconnect structure 30 is more than twice the thickness 12 of each of the insulating layers 22, 24, and 26.

As was previously described, from the viewpoint of restriction imposed during the molding of the resin layer 11 and reduction of the height of the interconnect substrate 1, the thickness $T_1$ of the core layer 10 is preferably greater than or equal to 100 μm and less than or equal to 200 μm.

According to at least one embodiment, an interconnect substrate for which warpage is further reduced is provided.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

One aspect of the subject-matter described herein is set out non-exclusively in the following numbered clause.

[Clause 1] A method of making an interconnect substrate that includes:

a core layer including a resin layer and a through interconnect, the resin layer being mainly composed of a non-photosensitive thermosetting resin, the through interconnect extending through the resin layer, the core layer having no reinforcement member contained therein;

a first interconnect structure including a plurality of first interconnect layers and a plurality of first insulating layers mainly composed of a photosensitive resin, the first interconnect structure being laminated on a first side of the core layer; and a second interconnect structure including a plurality of second interconnect layers and a single second insulating layer mainly composed of a photosensitive resin, the second interconnect structure being laminated on a second side of the core layer, wherein the first interconnect layers and the second interconnect layers are electrically connected via the through interconnect, wherein the core layer has greater rigidity than the first interconnect structure and the second interconnect structure, wherein a thickness of the second interconnect structure is greater than a thickness of each of the first insulating layers, and wherein the second interconnect layers include a pad and a via interconnect, the pad being exposed through the second insulating layer, the via interconnect being disposed in the second insulating layer to provide an electrical connection between the pad and the through interconnect, the method comprising:

forming the second insulating layer to cover the pad;

forming, through the second insulating layer, a via hole that exposes the pad;

forming the via interconnect such that the via interconnect fills the via hole, and forming the through interconnect such that the through interconnect is seamlessly integrated with the via interconnect, and such that the through interconnect protrudes from the second insulating layer;

forming the resin layer on the second insulating layer to cover an upper surface and side surface of the through interconnect;

polishing an upper surface of the resin layer to expose the upper surface of the through interconnect; and laminating the first interconnect structure on the upper surface of the resin layer and the upper surface of the through interconnect.

What is claimed is:

1. An interconnect substrate comprising:

a core layer including a resin layer and a through interconnect, the resin layer being mainly composed of a non-photosensitive thermosetting resin, the through interconnect extending through the resin layer, the core layer having no reinforcement member contained therein;

a first interconnect structure including a plurality of first interconnect layers and a plurality of first insulating layers mainly composed of a photosensitive resin, the first interconnect structure being laminated on a first side of the core layer; and a second interconnect structure including a plurality of second interconnect layers and a single second insulating layer mainly composed of a photosensitive resin, the second interconnect structure being laminated on a second side of the core layer, wherein the first interconnect layers are electrically connected to the second interconnect layers via the through interconnect, wherein the core layer has greater rigidity than the first interconnect structure and the second interconnect structure, and wherein a thickness of the second interconnect structure is greater than a thickness of each of the first insulating layers.

2. The interconnect substrate as claimed in claim 1, wherein a thickness of the core layer is greater than a thickness of the first interconnect structure and the thickness of the second interconnect structure.

3. The interconnect substrate as claimed in claim 1, wherein a thickness of the first interconnect structure is substantially equal to the thickness of the second interconnect structure.

4. The interconnect substrate as claimed in claim 1, wherein a Young's modulus of the core layer is greater than or equal to 5000 MPa, and less than or equal to 25000 MPa.

5. The interconnect substrate as claimed in claim 1, wherein a thermal expansion coefficient of the resin layer is less than thermal expansion coefficients of the first insulating layers and the 20 second insulating layer.

6. The interconnect substrate as claimed in claim 1, wherein the second interconnect layers include a pad and a via interconnect, the pad being exposed through the second insulating layer, the via interconnect being disposed in the second insulating layer to provide an electrical connection between the pad and the through interconnect, the via interconnect and the through interconnect being formed together as one seamless piece.

7. The interconnect substrate as claimed in claim 6, wherein a width of the via interconnect increases with a distance from the pad toward the through interconnect.

8. The interconnect substrate as claimed in claim 6, wherein a width of the via interconnect at a point of contact with the through interconnect is narrower than a width of the through interconnect at a point of contact with the via interconnect.

* * * * *